United States Patent
Reymond

[11] Patent Number: 6,075,432
[45] Date of Patent: Jun. 13, 2000

[54] METHOD FOR GENERATING ENHANCED ETCHED INDUCTOR ELEMENTS

[75] Inventor: Welles Reymond, Waterbury, Conn.

[73] Assignee: General Data Comm, Inc., Middlebury, Conn.

[21] Appl. No.: 08/853,813

[22] Filed: May 9, 1997

[51] Int. Cl.[7] ...................................................... H01F 5/00
[52] U.S. Cl. .......................... 336/200; 336/223; 336/232; 428/209; 428/901
[58] Field of Search ................................... 428/209, 901, 428/621; 336/200, 223, 232

[56] References Cited

U.S. PATENT DOCUMENTS

| | | | |
|---|---|---|---|
| 3,367,795 | 2/1968 | Stutzman | 428/209 |
| 3,798,059 | 3/1974 | Astle et al. | 117/212 |
| 4,942,373 | 7/1990 | Ozawa et al. | 333/161 |
| 5,398,400 | 3/1995 | Breen | 29/602.1 |
| 5,529,831 | 6/1996 | Waga et al. | 428/901 |

*Primary Examiner*—Cathy F. Lam
*Attorney, Agent, or Firm*—David P. Gordon; David S. Jacobson; Thomas A. Gallagher

[57] ABSTRACT

An inductor element comprises a copper pattern on a PCB on which a magnetic powder is deposited. The inductor is formed according to the method of the invention by etching a copper layer of a PCB in a desired pattern. A magnetic powder-loaded ink is then screened or stenciled over the pattern of the inductor elements etched in the copper layer of the PCB. The resulting inductor element is enhanced, having increased low frequency inductance and increased high frequency loss. Multiple inductor elements may be formed on a single PCB in a single process without requiring further cost or steps in the method.

8 Claims, 2 Drawing Sheets

METHOD FOR GENERATING ENHANCED ETCHED INDUCTOR ELEMENTS

BACKGROUND OF THE INVENTION

1. Field of the Invention

This invention relates broadly to inductors for printed circuit boards. More particularly, this invention relates to inductor elements etched onto printed circuit boards.

2. State of the Art

It is known to generate inductor elements on a printed circuit board (PCB) by etching a pattern in a conductive layer of the PCB. Referring to prior art FIGS. 1 through 3, a printed circuit board 10 is shown having a non-conductive structural layer 12 and a conductive layer 14, which is typically made of copper. The conductive layer 14 is etched to provide circuit connection patterns 16 which function as inductor elements 18, 20, as well as lead traces (not shown). One particular application for this approach is to create a series inductor for decoupling the power to integrated circuits. One advantage of these etched inductor elements is that there is substantially no cost associated with their production, except for the surface area of PCB used for the inductor elements. This is because the inductor elements are generated during the normal etching process of the PCB.

The design latitude for etched inductor elements, however, is quite limited in inductance range. Furthermore, there are substantial trade-offs between PCB surface area, inductance, self-resonant frequency, and high frequency loss. For example, large inductance values (above 100 nH) require substantial surface area (greater than 0.2 in$^2$). Moreover, a separate resistor component 22 is often required to control damping in an etched inductor element 20.

SUMMARY OF THE INVENTION

It is therefore an object of the invention to provide a method of increasing the inductance of an etched inductor element without increasing the surface area of the inductor element.

It is another object of the invention to provide a method of increasing the high frequency loss of an etched inductor element, thereby eliminating the need for a separate resistor.

It is also object of the invention to provide an inductor element made by the method of the invention.

It is a further object of the invention to provide an inductor element having relatively greater low frequency inductance and more high frequency loss, and requiring relatively less surface area.

In accord with these objects which will be discussed in detail below, the inductor element of the invention comprises a copper pattern on a PCB on which a magnetic powder is deposited. The inductor element is formed according to the method of the invention by etching a copper layer of a PCB in a desired pattern (i.e., in the same manner that other traces are formed). A magnetic powder-loaded ink is then screened or stenciled over the pattern of the inductor element etched in the copper layer of the PCB. The resulting inductor element is enhanced, having increased low frequency inductance and increased high frequency loss. As a result, inductor elements may be made smaller, requiring less surface area on a PCB. Multiple inductor elements may be formed on a single PCB using the same process without requiring further steps in the method and at most a nominal cost.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 4:
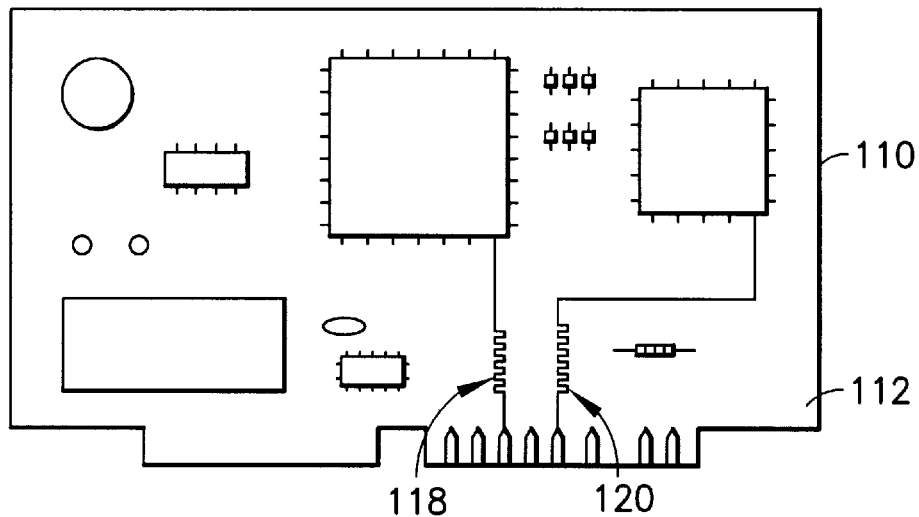
FIG. 4 is a fanciful schematic view of a printed circuit board having enhanced etched inductor elements according to the invention.
Figure 5:
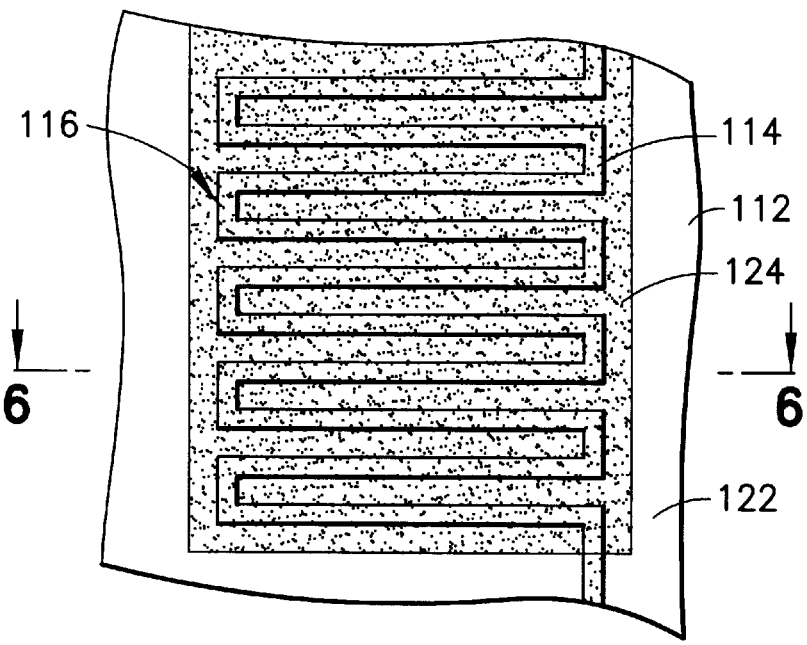
FIG. 5 is a fanciful enlarged broken top view of the enhanced etched inductor element according to the invention.
Figure 6:
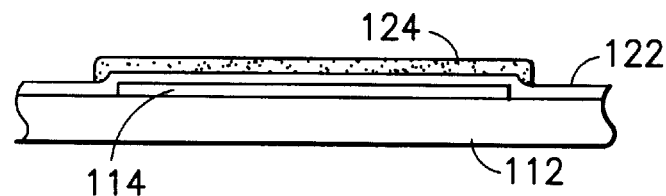
FIG. 6 is a cross section through line 6—6 in FIG. 5.

Turning now to FIGS. 4 through 6, a printed circuit board (PCB) 110 is shown. The PCB 110 includes a non-conductive structural layer 112 and a conductive layer 114, preferably made of copper. Patterns, e.g. serpentine pattern 116, etched in the outer layer 114 provide inductor elements 118, 120 and traces (not shown). A solder mask 122 (a thin non-conductive layer generally applied over the entire PCB except where a solder contact is desired) is preferably provided on the PCB 110. A magnetic substance 124 is deposited on the solder mask 122 and over the inductive circuit patterns (e.g., 116). Preferably the magnetic substance 124 is a slurry or paste of fine magnetic particles mixed in an epoxy ink to create a magnetically loaded ink. Presently preferred magnetic particles include hard and soft ferrite, moly-Permalloy∩ (a high nickel-molybdenum-iron alloy), and powdered iron.

According to the method of the invention, the conductive layer 114 of the PCB is first etched in order to form a desired inductor element circuit pattern 116 as well as other traces (not shown). The solder mask is then applied over the PCB except where a solder contact is desired. Finally, the magnetic substance 124 is screened (or stenciled) over the pattern of the inductor element circuit pattern 116. Screening is generally preferable where the desired thickness of the magnetic substance is less than 0.001 inches, and a slurry is preferably used with the screening process. Stenciling is generally preferable where the desired thickness of the magnetic substance is greater than 0.001 inches, and a paste is preferably used in the stenciling process. In addition, stenciling is preferable where greater control over the thickness of the ink is desired, as the thickness of the stencil controls the thickness of the coating. The screening (or stenciling) process for applying the magnetic substance 124 is a batch photolithographic process and similar to the screening process commonly used for nomenclature on existing PCBs and which is known in the art. Because the screening process is a batch photolithographic process, the effective cost of screening inductive circuit patterns on a PCB is fixed, independent of the number of inductive patterns coated, as all the inductor elements will be screened at once.

Figure 1:
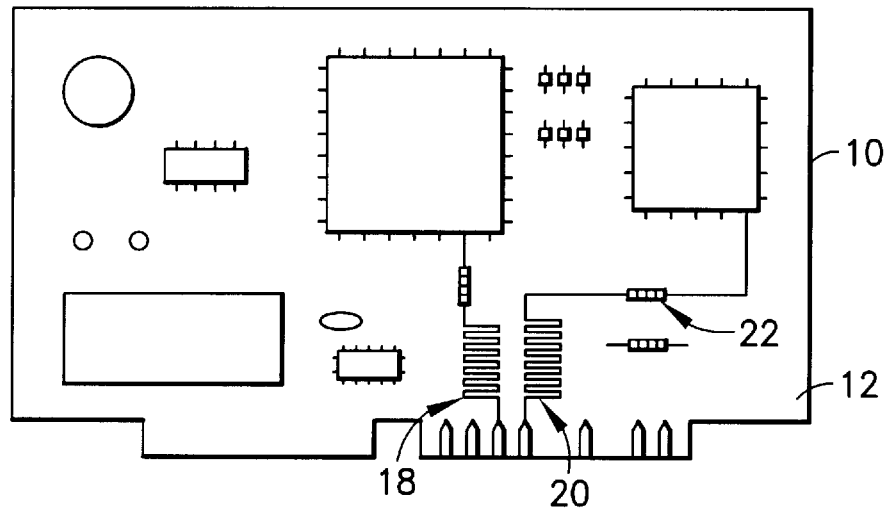
FIG. 1 is a fanciful schematic view of a prior art printed circuit board having etched inductor elements.
Figure 2:
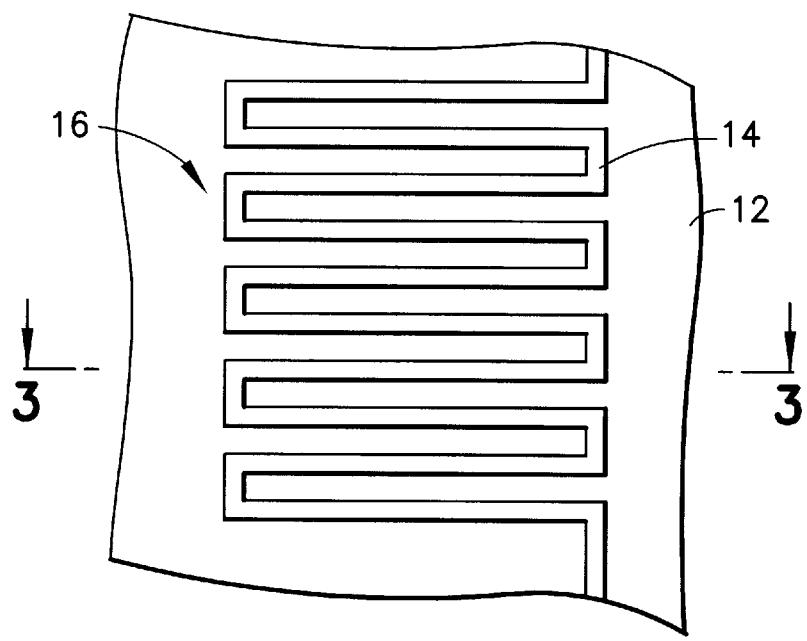
FIG. 2 is a fanciful enlarged broken top view of an etched inductor element on a printed circuit board.
Figure 3:
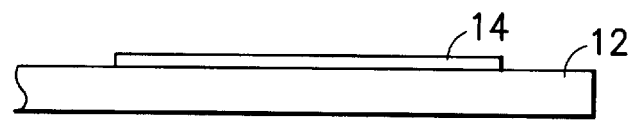
FIG. 3 is a cross section through line 3—3 in FIG. 2.

Two significant benefits are provided by applying the magnetic substance 124 over inductor element circuit patterns. First, the low frequency inductance of the inductor elements 118, 120 is easily increased by a factor of at least two, thereby enabling inductor elements which require reduced surface area to produce the same inductance as that of relatively larger prior art etched inductor elements. Alternatively, higher inductance inductors than would otherwise be feasible without the use of discrete components can be generated directly on the PCB. Second, high frequency loss can be beneficially increased, thereby eliminating the need for an additional damping resistor component sometimes required by prior art etched inductor elements. This is shown by a comparison of elements 20 and 22 in FIG. 1 to the analogous single element 120 in FIG. 4.

There have been described and illustrated herein a PCB having an enhanced etched inductor and a method of generating the enhanced etched inductor on the PCB. While particular embodiments of the invention have been described, it is not intended that the invention be limited thereto, as it is intended that the invention be as broad in scope as the art will allow and that the specification be read likewise. Thus, while particular magnetic powders have been disclosed, it will be appreciated that other magnetic powders may be used as well. Also, while the magnetic powder is preferably provided in a slurry or paste for screening and stenciling, it will be appreciated that the magnetic substance may be deposited in another form and/or in another manner. Furthermore, while an exemplar inductor pattern is shown in the drawings, it will be appreciated that other patterns may be used as well. In addition, while the magnetic ink is described as being on the solder mask, it will be appreciated that the magnetic ink may be applied directly to the conductive layer or may be applied over other interposing layers; i.e, the key factor is the proximity of the magnetic substance to the inductor pattern rather than contact between the magnetic substance and any particular layer. Moreover, enhanced inductor elements may be provided on one or more of the conductive layers of a multilayer PCB. Furthermore, it will be appreciated that the enhanced etched inductor elements may be physically located under other discrete elements on the PCB. It will therefore be appreciated by those skilled in the art that yet other modifications could be made to the provided invention without deviating from its spirit and scope as so claimed.

I claim:

1. A printed circuit board, comprising:

a) a non-conductive substrate layer;

b) a copper homogeneous conductive outer layer adjacent to said non-conductive substrate layer, said conductive outer layer forming an inductive element pattern; and c) a single magnetic substance layer deposited at least partially over said inductive element pattern, said magnetic substance comprising a slurry or paste epoxy having magnetic particles;

d) a solder mask is applied over said copper conductive outer layer and upon which said magnetic substance is applied.

2. A printed circuit board according to claim 1, wherein:

said magnetic particles comprise at least one of ferrite, powdered iron, and high nickel-molybdenum-iron alloy powder.

3. A printed circuit board according to claim 1, wherein:

said inductive element pattern has a flat serpentine configuration.

4. A printed circuit board, comprising:

a) a non-conductive substrate layer;

b) a conductive outer layer directly atop said non-conductive substrate layer, said conductive outer layer including a one-level inductive element pattern;

c) a solder mask directly atop said inductive element pattern; and d) a magnetic substance directly atop said solder mask.

5. A printed circuit board according to claim 4, wherein:

said conductive outer layer comprises copper.

6. A printed circuit board according to claim 4, wherein:

said magnetic substance comprises a slurry or paste epoxy having magnetic particles.

7. A printed circuit board according to claim 6, wherein:

said magnetic particles comprise at least one of ferrite, powdered iron, and high nickel-molybdenum iron alloy powder.

8. A printed circuit board according to claim 4, wherein:

said inductive element pattern has a flat serpentine configuration.

* * * * *